(12) United States Patent
Brems et al.

(10) Patent No.: US 9,673,373 B2
(45) Date of Patent: Jun. 6, 2017

(54) SYSTEM FOR DELIVERING ULTRASONIC ENERGY TO A LIQUID AND USE FOR CLEANING OF SOLID PARTS

(71) Applicant: IMEC, Leuven (BE)

(72) Inventors: Steven Brems, Kessel-Lo (BE); Paul Mertens, Bonheiden (BE)

(73) Assignee: IMEC, Leuven (BE)

( * ) Notice: Subject to any disclaimer, the term of this patent is extended or adjusted under 35 U.S.C. 154(b) by 764 days.

(21) Appl. No.: 13/967,950

(22) Filed: Aug. 15, 2013

(65) Prior Publication Data

US 2014/0053864 A1 Feb. 27, 2014

(30) Foreign Application Priority Data

Aug. 27, 2012 (EP) ..................................... 12181888

(51) Int. Cl.
*H01L 41/09* (2006.01)
*B08B 3/12* (2006.01)
*B06B 1/06* (2006.01)
*H01L 21/67* (2006.01)

(52) U.S. Cl.
CPC ............ *H01L 41/09* (2013.01); *B06B 1/0622* (2013.01); *B08B 3/12* (2013.01); *B06B 1/0688* (2013.01); *B06B 2201/20* (2013.01); *B06B 2201/71* (2013.01); *H01L 21/67086* (2013.01)

(58) Field of Classification Search
USPC ................................................ 310/311–371
See application file for complete search history.

(56) References Cited

U.S. PATENT DOCUMENTS

| | | | |
|---|---|---|---|
| 3,893,869 A | | 7/1975 | Mayer et al. |
| 5,218,980 A | * | 6/1993 | Evans ................. A47L 15/0002 134/1 |
| 5,777,860 A | * | 7/1998 | Halbert ................. B06B 1/0253 310/316.01 |

(Continued)

FOREIGN PATENT DOCUMENTS

WO 2005/044440 A2 5/2005

OTHER PUBLICATIONS

Harrison, J.S. et al., "Piezoelectric Polymers", NASA/CR-2001-211422, ICASE Report No. 2001-43, Dec. 2001, pp. 1-27.

*Primary Examiner* — Thomas Dougherty
(74) *Attorney, Agent, or Firm* — McDonnell Boehnen Hulbert & Berghoff LLP (57) ABSTRACT

This present application relates to a system for delivering megasonic energy to a liquid, involving one or more megasonic transducers, each transducer having a single operating frequency within an ultrasound bandwidth and comprising two or more groups of piezoelectric elements arranged in one or more rows, and a megasonic generator means for driving the one or more transducers at frequencies within the bandwidth, the generator means being adapted for changing the voltage applied to each group of piezoelectric elements so as to achieve substantially the same maximum acoustic pressure for each group of piezoelectric elements. The generator means and transducers being constructed and arranged so as to produce ultrasound within the liquid. Such a system may be part of an apparatus for cleaning a surface of an article such as a semiconductor wafer or a medical implant.

16 Claims, 5 Drawing Sheets

(56) References Cited

U.S. PATENT DOCUMENTS

| | | | |
|---|---|---|---|
| 5,895,997 A * | 4/1999 | Puskas | B06B 1/0284 134/1 |
| 5,911,232 A | 6/1999 | Mokuo et al. | |
| 6,016,821 A | 1/2000 | Puskas | |
| 6,138,698 A | 10/2000 | Tanaka et al. | |
| 6,181,051 B1 | 1/2001 | Puskas | |
| 2004/0182414 A1 | 9/2004 | Puskas | |
| 2004/0250844 A1* | 12/2004 | Kumazaki | A47L 13/00 134/201 |
| 2005/0003737 A1 | 1/2005 | Montierth et al. | |
| 2005/0098194 A1 | 5/2005 | Christenson et al. | |
| 2005/0122003 A1* | 6/2005 | Goodson | B08B 3/12 310/334 |
| 2006/0197409 A1 | 9/2006 | Thiele | |
| 2007/0182285 A1 | 8/2007 | Goodson | |
| 2008/0029125 A1* | 2/2008 | Olesen | B08B 3/12 134/1.3 |
| 2008/0129146 A1* | 6/2008 | Puskas | B06B 1/0284 310/317 |
| 2011/0094548 A1 | 4/2011 | Goodson | |
| 2012/0046765 A1* | 2/2012 | Nikolic | B06B 1/0253 700/90 |

* cited by examiner

SYSTEM FOR DELIVERING ULTRASONIC ENERGY TO A LIQUID AND USE FOR CLEANING OF SOLID PARTS

CROSS REFERENCE TO RELATED APPLICATIONS

Pursuant to the provisions of 35 U.S.C. §119(b), this application claims priority to EP12181888.4 filed Aug. 27, 2012, the entire contents of which are incorporated herein by reference.

FIELD OF TECHNOLOGY

The present application relates to systems for delivering megasonic energy to a liquid that can be used for cleaning a surface of an article being immersed in the liquid. The present application further relates to an apparatus and a method for cleaning or processing a surface of solid parts or articles, e.g. semiconductor wafers, medical implants, parts of a ship, etc. Particularly, the present application relates to megasonic systems, and methods of operating the same, which enhance the use of megasonic energy within a liquid.

BACKGROUND

Acoustic cleaning of solid parts submersed in a liquid cleaning bath such as, but not limited to, an aqueous cleaning solution, is a known cleaning method. Ultrasonic methods operating at a low acoustic wave frequency of about 20 kHz to 100 kHz may cause violent and random cavitation effects which in turn may produce damage to fragile structures or even erosion of surfaces. In addressing this problem, previous methods have primarily focused on utilizing high frequency ultrasound in the processing and cleaning of semiconductor wafers and other delicate parts. These high frequency systems are single-frequency, continuous wave systems which operate from about 600 kHz to about 2 Mhz, a frequency range which is referred to as "megasonics." U.S. Pat. No. 3,893,869 discloses a megasonic apparatus comprising means for immersing an article, having a surface to be cleaned, in a container of cleaning fluid. A transducer, adapted to oscillate at a frequency in the range of between 0.2 and 5 MHz, is disposed within the container and positioned so as to produce a beam of ultrasonic energy substantially parallel to the surface to be cleaned. When cleaned, the article is removed from the container and rinsed in a liquid rinse. The article is then dried in clean air at a temperature of between 25° and 300° C. The transducers of available systems involve, as an active element, a piezoelectric ceramic or polymer driven at its resonant frequency by a single frequency continuous-wave generator. This active element converts electrical energy to acoustic energy, and vice versa. The active element may be a piece of polarized material, with electrodes attached to two of its opposite faces, which can be cut in various ways to produce different wave modes. The thickness of the active element is determined by the desired frequency of the transducer. Also relevant is the concept of bandwidth, or range of frequencies, associated with a transducer. The nominal frequency of a transducer is the central frequency and may depend also on the backing material. Highly damped transducers will respond to frequencies above and below the central frequency. Megasonic cleaning, which is currently mainly used in the silicon semi-conductor industry, results into a gentler cavitation than ultrasonic cleaning, and may significantly reduce cavitation erosion and the likelihood of surface damage to the product surface being cleaned as compared to low frequency systems. Similar to ultrasonic cleaning, megasonic methods uses a transducer usually made of piezoelectric elements. Cavitation is generally known and defined as the activity of bubbles (e.g., gas bubbles) in a liquid. Such activity includes growth, pulsation and/or collapse of bubbles in a liquid. The pulsation of bubbles is known as stable cavitation, whereas the collapse of bubbles is known as transient cavitation. The occurrence of transient cavitation can release high amounts of energy towards an area surrounding the cavitation. Such energy may be, for example, in the form of heat, shockwaves, etc.

Transient cavitation is applied in a large number of technical fields. For example, in sonochemistry, bubbles collapsing in an ultrasonic field have a catalytic effect on chemical reactions. Also, cavitation is used in medical applications, for example, as a contrast enhancer in ultrasound diagnostics. However, one of the best-known applications of cavitation may be the removal of particles from a surface of a substrate, such as a semiconductor substrate. Megasonic systems are not free from technical problems. A problem of megasonic systems may relates to the nature of high frequency sound waves in a liquid, which travel like a beam within a liquid, and further exhibit higher attenuation than low frequency systems. The beam effect may make it difficult to uniformly fill the cleaning container with the acoustic field.

The sound waves that emanate from an ultrasonic or megasonic transducer originate from multiple points along the surface of the piezoelectric element, and they propagate out from the transducer with a circular wave front. Where the waves interact, there are areas of constructive and destructive interference, the points of constructive interference being often referred to as nodes. Near the face of the transducer, there are extensive fluctuations or nodes and the sound field is very uneven. This is known as the near field or Fresnel zone. The sound field is more uniform away from the transducer in the far field or Fraunhofer zone, where the beam spreads out in a pattern originating from the center of the transducer. But even in the far field it is not a uniform wave front.

U.S. Pat. No. 6,181,051 discloses a system for delivering ultrasound to a liquid, comprising:

one or more ultrasonic transducers, each transducer having an operating frequency within an ultrasound bandwidth; and an ultrasound generator means for driving the transducers at frequencies within the bandwidth, the generator being amplitude modulated at a modulation frequency and having amplitude modulation frequency sweep means for sweeping the modulation frequency as a function of time, the generator means and transducers being constructed and arranged so as to produce amplitude modulated ultrasound within the liquid.

Despite some improvements already available from the current megasonic methods and systems delivering energy to a liquid, there is still a need for reducing or eliminating cavitation erosion and surface damage caused to a product or article being immersed in the liquid by providing better control on cavitation and/or on acoustic field uniformity, i.e. by enhancing the use of megasonic energy within the cleaning liquid.

SUMMARY

An object of the present application is to provide cleaning methods and systems wherein surface damage caused to the product being cleaned may be significantly reduced or eliminated by providing better control of the acoustic field uniformity during operation of the system.

The cleaning methods and systems of the present application are based on delivering megasonic energy to a liquid with one or more megasonic transducers having two or more rows of piezoelectric elements being driven by megasonic generator means. In a first aspect, the present application is based on the surprising finding that surface damage that may be caused to the product being cleaned with such systems can be significantly reduced or eliminated by improving the uniformity of the acoustic field being delivered e.g. by minimizing acoustic pressure differences due to interference effects of sound waves coming from the transducer. This can be achieved for instance by adapting the megasonic generator means for alternatively or sequentially changing the voltage applied to each group of piezoelectric elements so that the maximum acoustic pressure achieved after a wafer movement is identical or substantially the same on each position of the wafer. The generator means is adapted for driving the one or more transducers to sequentially apply acoustic field over a complete period of a pulsed control signal used for the driving of the one or more transducers. The pulse off time, which depends upon the dissolved gas concentration in the liquid, may represent from 3 to 4 times the pulse on time.

In a second aspect the present application is based on the surprising finding that surface damage that may be caused to the product being cleaned with such systems can be significantly reduced or eliminated by further minimizing interaction or interference between the piezoelectric elements of the transducer, e.g. by selecting an appropriate geometry for the piezoelectric elements. This can be achieved for instance by the use of piezoelectric elements circular in shape being positioned relatively to each other in such a way to minimize acoustic pressure differences due to distance changes between each row of piezoelectric elements of the transducer and the surface of the solid substrate or article being cleaned. Also the velocity of the product to be cleaned is adapted in such a way that the product is subjected to a substantially uniform acoustic pressure all over its surface, for instance a maximum product velocity of about 32 mm/s.

In each aspect of the present application, the piezoelectric elements can be made from a piezoelectric ceramic or polymer.

DETAILED DESCRIPTION

A broad embodiment of the first aspect of the present application relates to a system for delivering megasonic energy to a liquid as defined in claim 1, i.e. a system comprising:
  one or more megasonic transducers, each transducer comprising two or more rows of piezoelectric elements and having a single operating frequency within an ultrasound bandwidth; and
  a megasonic generator means for driving the one or more transducers at frequencies within the bandwidth, the megasonic generator means and transducers being constructed and arranged so as to produce ultrasound within the liquid, and the megasonic generator means being adapted for changing the voltage applied to each group of piezoelectric elements so as to achieve substantially the same maximum acoustic pressure for each individual and grouped piezoelectric elements, As can be appreciated by the skilled person, various embodiments can be realized within this broad definition of the system for delivering megasonic energy to a liquid according to the present applications. A few non-limiting examples of such embodiments and preferred embodiments are described hereinafter.

A first parameter of the system is the nature, shape and arrangement of piezoelectric elements constituting a piezoelectric transducer within the system of the present applications. Piezoelectric materials suitable for the piezoelectric elements of each megasonic transducer include, but are not limited to, the following:
  Piezoelectric ceramics such as barium titanate ($BaTiO_3$), lead zirconate titanate (PZT), lead titanate, and lead metaniobate ($PbNb_2O_6$);
  Piezoelectric semi-crystalline polymers such as polyvinylidene fluoride (PVDF) and poly(vinylidene fluoride-trifluoroethylene and tetrafluoro-ethylene) copolymers, polyamides (odd-numbered nylons, e.g. nylon-5, nylon-7 and nylon-11), aliphatic and aromatic polyureas. Details of such materials may be found in the NASA Report No. 2001-43 by J. S. Harrison et al, the content of which is incorporated herein by reference. As is already known to the skilled person, due to the low acoustic impedance of liquids and the high impedance of ceramics, only a fraction of the acoustic energy generated by the piezoelectric element is transferred into the medium of propagation, therefore piezoelectric semi-crystalline polymers better match with the low acoustic impedance of liquids;
  Piezoelectric composites e.g. consisting of ceramic rods (e.g. PZT), arranged in parallel to one another, embedded in an epoxy resin matrix.

A suitable piezoelectric material may be selected by the skilled person on the basis of a combination of physical properties such as, but not limited to, acoustic impedance, resonant frequency, coupling coefficient (both in the thickness mode and the radial mode), relative dielectricity, mechanical stability and maximum operating temperature. The main requirement of the piezoelectric element or material may be the capacity to reach the resonant frequency within the ultrasound bandwidth desired for the transducer of the present application, as defined herein below, also possibly taking into account the operating temperature. A second feature of the piezoelectric element or material is the capacity to be formed into various shapes and sizes and to keep the predetermined shape, without shrinkage or disintegration, at high temperatures. Since however the cleaning liquid used in the cleaning method of the present application, or in combination with the cleaning apparatus of the present application usually is an aqueous solution, it may be sufficient that the piezoelectric material withstands an operating temperature of about 80° C., a condition that is met by all of the above-listed materials.

Piezoelectric elements constituting a piezoelectric megasonic transducer for use in the system of the present applications may exhibit different geometric shapes such as square, rectangle, trapezoid, circle, ellipse, ovoid, and so on. However the choice of the transducer piezoelectric element shape is not without consequences on the efficiency of the system. In particular it has been found that the selection of an appropriate geometry may be able to minimize acoustic pressure differences due to distance changes between the piezoelectric elements of the transducer and the surface of the solid substrate or article being cleaned, and consequently to improve cleaning efficiency whilst avoiding damage to the surface.

For instance circular (disc shaped) piezoelectric elements are chosen to minimize interference between these elements, and the resulting transducer design also reduces distance changes between the piezoelectric rows and the solid article (e.g. semi-conductor wafer) surface. A representative embodiment of this concept is defined in claim 7.

Piezoelectric elements constituting a piezoelectric megasonic transducer for use in the system of the present applications may exhibit different dimensions such as width and length, also taking into account their shape as outlined herein-above. Whatever the piezoelectric element shape, the dimensions (e.g. width and length) of a piezoelectric element may be within a range from 5 to 20 mm. In an embodiment, a circular piezoelectric element has a diameter within a range from 5 to 20 mm. For instance each dimension (e.g. width and length, or diameter) may be from 7 to 18 mm, more particularly from 10 to 15 mm. A representative embodiment of this concept is defined in claim 8.

Figure 2:
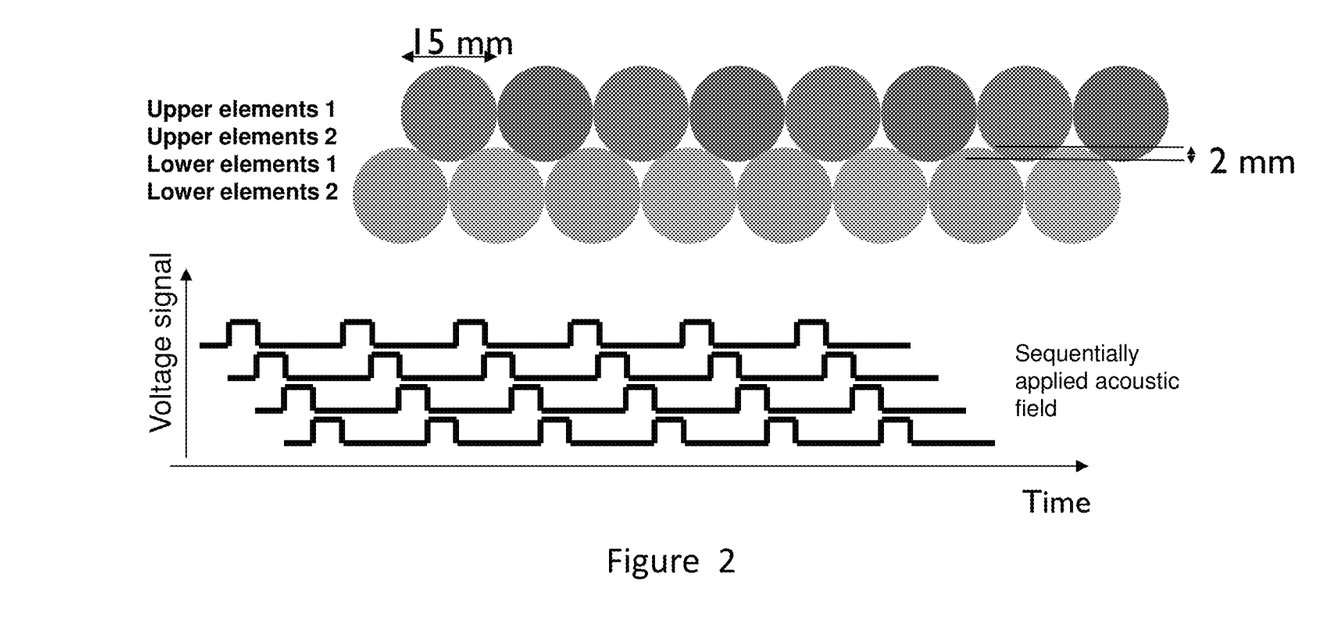
FIG. 2 shows a schematic representation of a transducer comprising four groups of circular piezoelectric elements being operated sequentially, together with the corresponding voltage-time graph of the circular piezoelectric elements according to one embodiment of a system of this application. Here, the four groups are ordered into two rows.

Piezoelectric elements constituting a piezoelectric megasonic transducer for use in the system of the present application may exhibit different arrangements. When circular piezoelectric elements are chosen, it has been surprisingly found that an arrangement such as shown in FIG. 2, including four grouped piezo-elements arranged into two rows, can minimize interferences and improve acoustic field pressure uniformity, thereby improving cleaning efficiency whilst avoiding/reducing damage to the surface being cleaned. The row of lower elements is geometrically displaced from the upper elements.

A feature of the system of the present application is a piezoelectric transducer, including all specific embodiments thereof as described herein-above, having a single operating frequency within an ultrasound bandwidth. The single operating frequency preferably ranges from 800 kHz to 5 MHz. For instance the single operating frequency may range from 900 kHz to 2 MHz. A representative embodiment of this kind is defined in claim 6.

Another feature of the system of the present application is achieving substantially the same maximum acoustic pressure for each group of piezoelectric elements. This feature can be checked or monitored by making use of measuring techniques such as, but not limited to, measuring acoustic pressure within the liquid, or measuring how dirt particles from the cleaned article are moved (e.g. rate) within the liquid, such measuring techniques being well known to the person skilled in the art.

Figure 1:
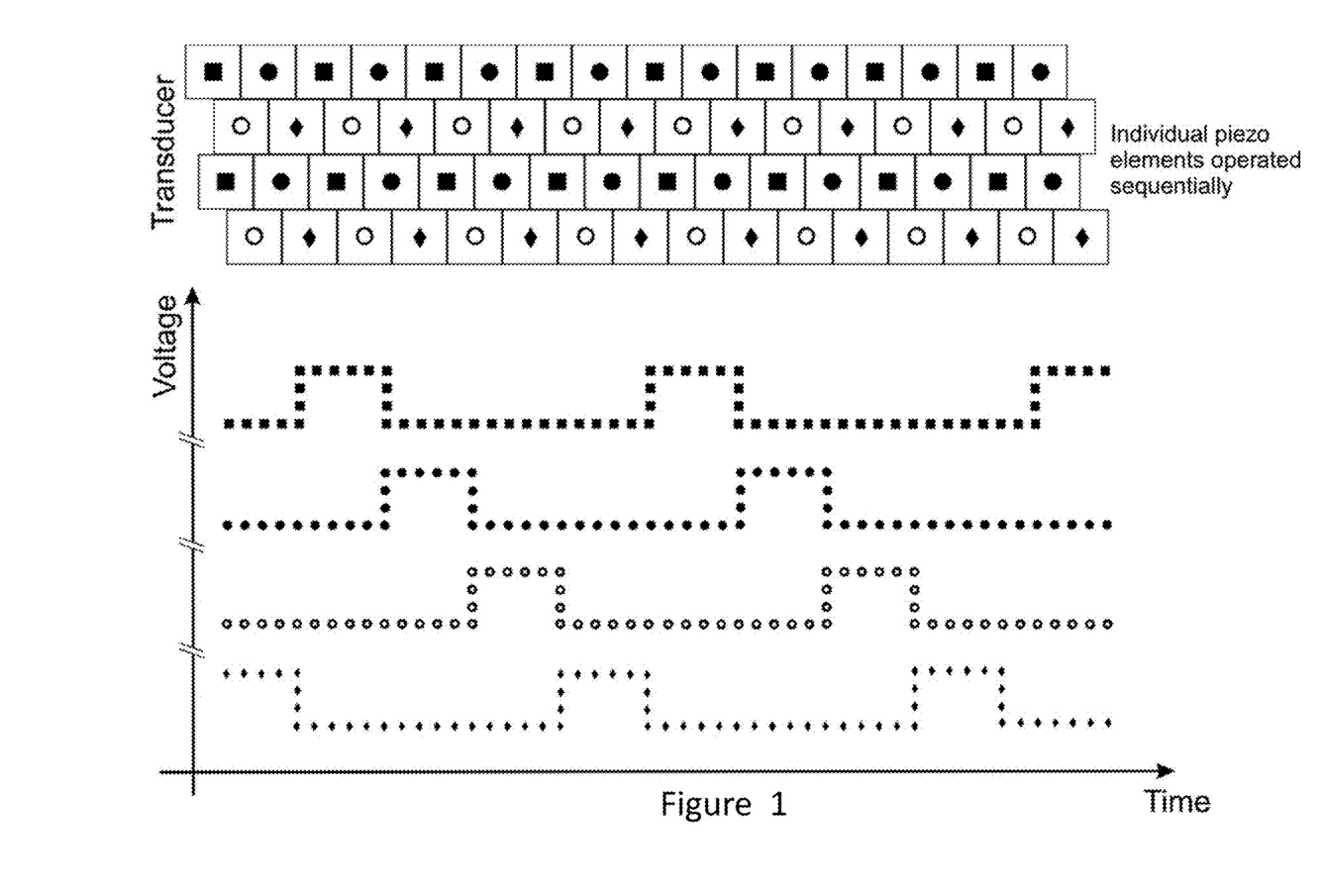
FIG. 1 shows a schematic representation of a transducer comprising of four groups (indicated by as ■, ●, ○, and ◆) of individual piezoelectric elements being operated sequentially, together with the corresponding voltage-time graph of each type of individual piezoelectric elements according to one embodiment of a system of this applications. In this specific case, 4 rows of piezo-elements are shown.
Figure 4:
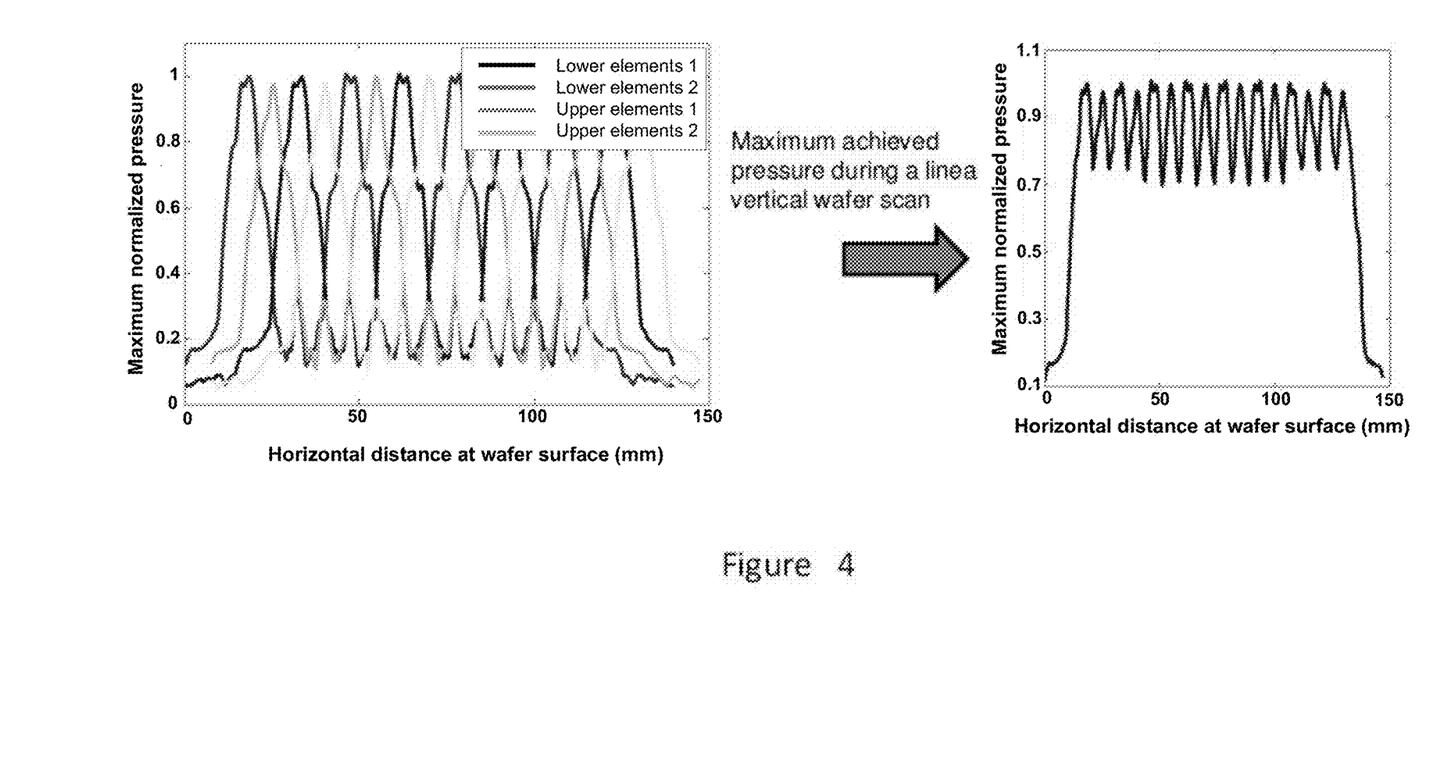
FIG. 4 shows the maximum normalized pressure, after a linear wafer scan, at the surface of a wafer with the four groups of piezoelectric elements of a transducer operated sequentially.

An embodiment of the first aspect of the present applications relates to a system for delivering megasonic energy to a liquid as defined in claim 2, i.e. a system wherein the megasonic generator means is adapted for driving the one or more transducers to sequentially apply acoustic field over a complete period of a pulsed control signal used for the driving. Such an embodiment is schematically shown in FIGS. 1, 2 and 4, as explained herein below. Different ways of adapting the megasonic generator means for a sequential acoustic pressure application are within the knowledge of the person skilled in the art, such a sequential change of the voltage applied to each group of piezoelectric elements. This includes for instance a pre-determination of the number and duration of sequences during the complete period of the pulsed signal such as, but not limited to the preferred embodiments described below.

Another embodiment of the first aspect of the present application relates to a system for delivering megasonic energy to a liquid as defined in claim 3, i.e. a system wherein the megasonic generator means is adapted so that no two adjacent piezoelectric elements are operating at the same time. Such a particular embodiment is schematically shown for instance in FIG. 1.

Figure 5:
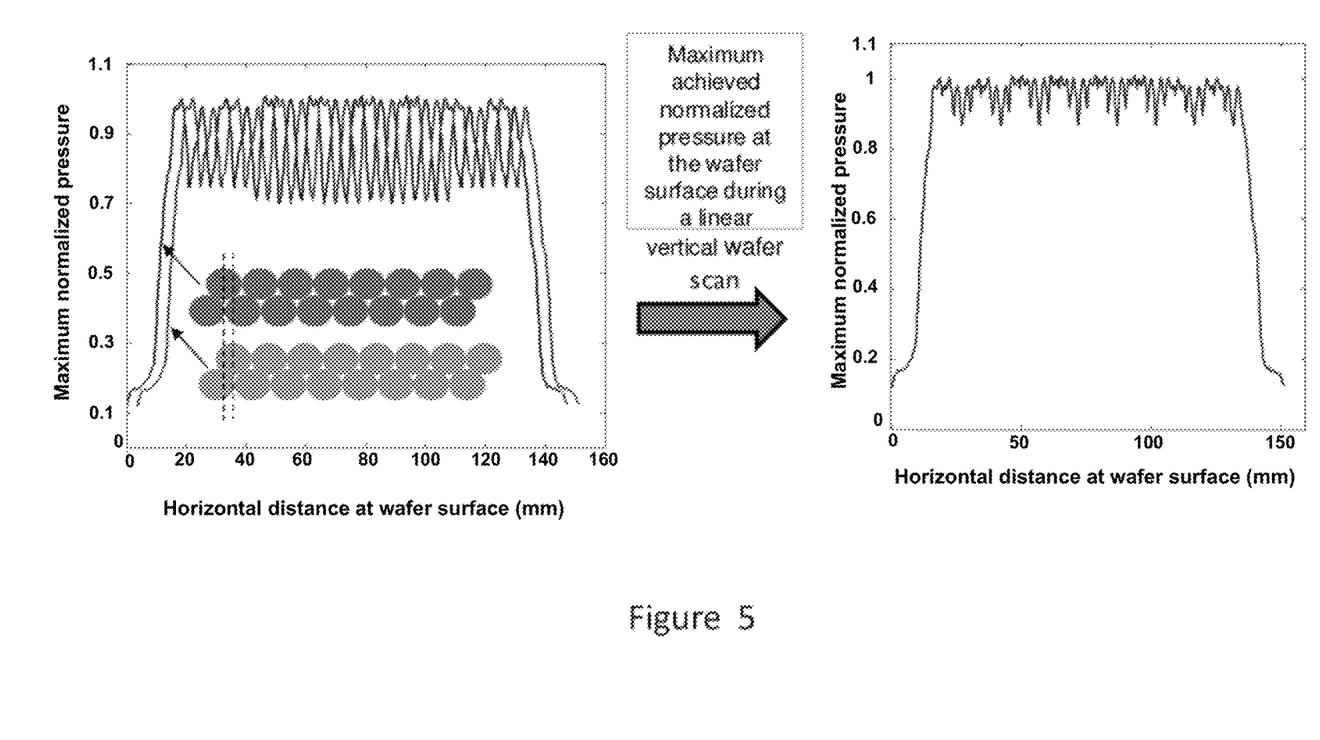
FIG. 5 shows the maximum normalized pressure, after a linear wafer scan, at the surface of a wafer with the four groups of piezoelectric elements of each transducer operated sequentially. Two (horizontally shifted) transducers are used to improve cleaning uniformity further.

Another embodiment of the first aspect of the present application relates to a system for delivering megasonic energy to a liquid as defined in claim 4, i.e. a system comprising at least two megasonic transducers, preferably two identical megasonic transducers, being horizontally displaced from each other. Such an embodiment is schematically shown in FIG. 5. By incorporating a second transducer which is shifted horizontally (by a distance of 0.5 to 5 mm from the first transducer in the embodiment of FIG. 5), the maximum acoustic pressure obtained after a vertical linear wafer scan has been found substantially uniform, thus again improving cleaning efficiency whilst avoiding damage to the surface being cleaned. Interaction of the at least two transducers may be neglected provided that a relatively large (at least 20 mm) vertical separation between two transducers is managed.

Another embodiment of the first aspect of the present application relates to a system for delivering megasonic energy to a liquid as defined in claim 5, i.e. a system comprising at least two megasonic transducers, preferably two identical megasonic transducers, being horizontally displaced from each other and wherein the horizontal displacement is adapted to improve acoustic field uniformity with respect to a single transducer system. The skilled person is aware of means for accurately measuring or observing acoustic field uniformity and consequently checking the level of improvement achieved by changing or modifying the horizontal displacement from one megasonic transducer to the other. Although such a construction may become more complicated and consequently more expensive, this embodiment of having more than one megasonic transducer can be generalized to three or more transducers. This way the skilled person can, without undue experimentation, determine the amount of horizontal displacement between megasonic transducers, and the number of transducers necessary to achieve substantial acoustic field uniformity in an economically optimal way.

All types of embodiments described hereinabove such as, but not limited to, the piezoelectric material, the operating ultrasound bandwidth, the number od transducers, the type (e.g. sequence) of voltage change applied to piezoelectric elements, the shape and size of piezoelectric elements, can be combined at will without departing from the scope of the present application.

Another aspect of the present application relates to the use of a system as defined herein-above, including all specific embodiments thereof, for cleaning a surface of an article being immersed in a liquid. The article to be cleaned may be any delicate article that cannot suitably be cleaned by more conventional (other than ultrasound) methods, for instance a semi-conductor device, a wafer, a medical implant, etc. The cleaning liquid referred to in such use preferably is an aqueous solution comprising water as the major component, optionally in combination with one or more organic or inorganic liquids miscible with water at the operating temperature such as, but not limited to, lower alcohols e.g. methanol, ethanol, isopropanol and the like. Clearly the kind and the amount organic or inorganic liquid admixed with water should be such that the resulting cleaning liquid is not corrosive or chemically reacting with the surface of the article or with the piezoelectric material at the operating temperature. The use involves operation of the system of the present applications by changing the voltage applied to each group of piezoelectric elements until substantially the same maximum acoustic pressure for each group of piezoelectric elements is achieved. Optionally, the method may further include a step of measuring the maximum acoustic pressure for each group of piezoelectric elements and a step of controlling whether a predetermined tolerance in the difference of maximum acoustic pressure from one group of piezoelectric elements to another group is exceeded or not. By means of such measuring and tolerance controlling steps, the duration of operation of the system of the present applications can be assessed more accurately.

The duration and sequence of the pulses are parameters relevant for enhancing cleaning efficiency.

Pulsing is a way to control the average bubble size in the cleaning solution. When the acoustic pulse is on, bubbles will grow if the acoustic pressure and dissolved gas concentrations are high enough. During the pulse off time (no acoustic field present), bubbles can dissolve due to the high internal gas pressure inside the bubble. Bubbles will only dissolve when the gas concentration is not too high. Therefore by using pulsing (and tuning the gas concentration), the average bubble size in the cleaning liquid can be controlled. Bubbles close to the resonance size are required for the transient cavitation regime (bubble collapse) which leads to maximum cleaning efficiency. Therefore, during the pulse off time, bubbles larger than resonance size should dissolve to bubbles smaller than resonance size. During the pulse on time, bubbles should grow again through the resonance radius and, in this way, maximum bubble activity and cleaning efficiency is obtained.

We surprisingly found out that the optimal pulse off time corresponds to the dissolution time of a resonant bubble. Therefore the optimal pulse off time depends on the dissolved gas concentration in the cleaning solution. A lower (higher) gas concentration results in a shorter (longer) optimal pulse off time. For example, for 105% dissolved oxygen gas, the optimal pulse off time is about 150-200 ms. For the same gas concentration, the optimal pulse on time has been determined experimentally and was approximately 50 ms, representing ¼ to ⅓ of the pulse on time.

For a chosen duration of the on and off pulses, the velocity of the object to be cleaned (e.g. a wafer) is adapted such that the object is subjected to a substantially uniform (the same/constant) acoustic pressure all over its area. Consequently, the cleaning efficiency is also uniform all over its area. For example, for a pulse on time of 50 ms and a pulse off time of 150 ms (at 105% dissolved $O_2$ gas in water), the maximum wafer velocity can be adapted such that a maximum pressure non-uniformity of about 10% is tolerated. In this particular example the transducer consists of circular disks with a diameter of 15 mm. Then the maximum distance the wafer may have traveled during the pulse off time of 150 ms is about 4.7 mm (width of the pressure peak of an individual piezoelectric element in which a maximum variation of 10% is obtained), which corresponds to a maximum wafer velocity of 4.7 mm/150 ms or 31 mm/s. If other gas concentrations are used, the optimal pulse times and the maximum allowed wafer velocity are adapted accordingly.

Operation of the system of the present application can be performed at any operating temperature compatible with the nature of the material constituting the piezoelectric elements and with the liquid state (i.e. the boiling temperature) of the medium into which the article to be cleaned has been immersed. The selection of an optimal operating temperature may be made by the person skilled in the art by taking into account that higher temperatures usually result into more damage to the substrate surface to be cleaned, but also more bubbles are nucleated/created within the liquid, meaning that a compromise may be established to properly balance these two factors. In practice it has been found that, in a aqueous medium, a suitable operating temperature ranges from 15° C. to 70° C., for instance from 20° C. to 50° C.

Yet another aspect of the present application relates to a kit or an apparatus comprising a system as defined hereinabove, including all specific embodiments thereof, as a component in combination with other components suitable for cleaning a surface of a solid article. In particular this aspect may take the form of an apparatus for cleaning a surface of an article, comprising:
  a container for a cleaning liquid for the article,
  a system for delivering megasonic energy to the liquid as defined herein-above in any one of the specific embodiments thereof, and
  means within the container for disposing the article with the surface at an angle of incidence from 15° to 45° with respect to the two or more rows of piezoelectric elements of the energy delivering system.

Figure 3:
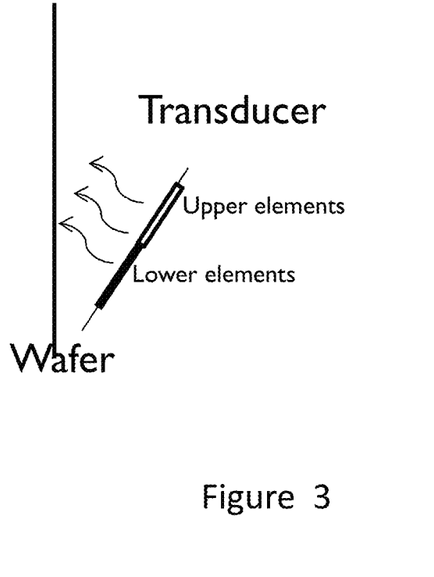
FIG. 3 shows the spatial arrangement of a transducer comprising piezoelectric elements with respect to the surface of a wafer to be cleaned by means of an apparatus according to one embodiment of this application.

Such an apparatus is schematically shown in FIG. 3. By operating the megasonic energy delivery system as described herein-before, i.e. by applying suitable voltage change for sufficient time within a suitable temperature range (e.g. from 15° C. to 70° C. when the liquid is an aqueous medium or cleaning solution), it may result in efficient cleaning of the surface of the article without causing damage to it.

The apparatus of the present application comprises a container or chamber for holding the cleaning liquid. This container or chamber may be made of any material suitable for sustaining ultrasound and receiving the cleaning liquid without being harmed by contacting it during the operating period of time. Such materials include, but are not limited to, stainless steel, polytetrafluoroethylene, fluorinated ethylene-propylene copolymers, poly-vinylidene fluoride, polypropylene, polyetherketone, titanium, aluminium, metal alloys, and the like. As shown in FIG. 3, it has been surprisingly found that substantial acoustic field uniformity and consequently efficient cleaning of the surface of the article are best achieved, as stated herein-above, by mounting the piezoelectric elements of the transducer at a suitable angle of incidence vis-à-vis the solid article (e.g. semi-conductor wafer or medical implant), such as the surface thereof, to be cleaned. In an embodiment of the present applications, this angle of incidence is from 20 to 40 degrees, or more specifically, from 25 to 35 degrees. Although this may be not necessary with a solid article having a flat or nearly flat surface, the means for disposing the surface of the article at an angle of incidence from 15° to 45° with respect to the two or more rows of piezoelectric elements of the transducer may be movable in order to match an uneven surface or the surface of a non-flat article. When the transducer is mounted at such an angle of incidence vis-à-vis the solid article or substrate, the distance between each row of piezoelectric elements and the solid article (e.g. wafer) is different. When such distance becomes larger, there is an increase in the interaction between the piezoelectric elements. Because the interaction between the piezoelectric elements should be minimized, attention may be paid to the transducer design, for instance by selecting circular piezoelectric elements of a suitable diameter as explained herein-above. In addition it may be useful to adopt a configuration of circular piezoelectric elements including a row of upper elements and a row of lower elements geometrically displaced from the upper elements as shown in FIG. 2.

A specific embodiment of the aspect of the present application relates to an apparatus for cleaning a surface of an article as defined in claim 12, i.e. an apparatus further comprising means for heating the cleaning liquid. Although it may also be practicable to supply the cleaning liquid to the apparatus at the desired operating temperature (for instance from 15° C. to 70° C.), in certain circumstances such as a continuous method, the apparatus may be configured to bring the cleaning solution to the desired operating temperature and/or to keep it at a constant temperature or to change the temperature during operation either according to a pre-defined temperature cycle or as a result of instantaneous acoustic uniformity control when needed.

Yet another aspect of the present application relates to a method for cleaning a surface of a solid article. The method involves an apparatus comprising a system as defined herein-above, i.e. having at least one transducer comprising two or more rows of piezoelectric elements, including all specific embodiments thereof, and a container or chamber for holding a cleaning liquid for the article.

The method comprises the steps of:
placing the solid article into the container in such manner that a substantial part of the surface of the article is at an angle of incidence from 15° to 45° (preferably from 20° to 40°, for instance from 25° to 35°) with respect to the two or more rows of piezoelectric elements of the transducer,
at least partly filling the container with a cleaning liquid, and
delivering megasonic energy to the liquid.

In order to meet the angle of incidence condition, a substantial part of the surface of the solid article to be cleaned is flat or nearly flat. The surface of the solid article to be cleaned may exhibit protruding portions, but the latter should not exceed the majority of the total surface in order to facilitate the placement of the solid article into the container. According to the present application, the delivery of megasonic energy to the liquid is preferably performed by changing the voltage applied to each group of piezoelectric elements of the transducer to minimize, reduce or remove differences in maximum acoustic pressure from one group to the other. In a particular embodiment of the present method, a sequential change is applied over a complete pulse period as explained herein-above.

The cleaning method of the present application preferably includes a step of filling the container with a cleaning liquid until the solid article is completely immersed in the liquid. As mentioned herein-above the cleaning liquid preferably is an aqueous solution being inert with respect to the solid article. In a specific embodiment of the present application, the method may be performed at an operating temperature within a range from 15° C. to 70° C. In order to be able to perform the method of the present application at different operating temperatures, the apparatus used in the method may further comprise means for heating the cleaning liquid. By actuating the heating means it is possible to use temperature as an operating parameter, i.e. to perform the method according to a pre-defined temperature cycle, or to adjust temperature as a result of the outcome of the cleaning process, especially when cleaning efficiency or surface damage are regularly or continuously monitored and have been found to be unsuitable.

The cleaning method of the present application may be applicable when a delicate part or article cannot be properly cleaned by conventional (other than ultrasound) methods, or suffers inadmissible surface damage during cleaning by the ultrasound methods of the prior art.

The set of examples below are given merely for the purpose of illustrating various non-limiting embodiments of the present applications and should not be construed as defining the scope thereof.

EXAMPLE 1

This example is illustrated by FIG. 1 schematically showing (top of the figure) a transducer comprising four rows of individual piezoelectric elements being noted as ■, ●, ○, and ◆ respectively. These piezoelectric elements are operated sequentially, at a single operating frequency of 928 kHz, according to the voltage-time graph of each type of individual piezoelectric elements shown at the bottom of the figure. It has been observed that this construction of a megasonic energy delivery system provides unique acoustic pressure uniformity when used in an aqueous liquid and is consequently useful for cleaning delicate parts or articles immersed in such a liquid.

EXAMPLE 2

This example is illustrated by FIG. 2 schematically showing a transducer comprising four rows of circular piezoelectric elements, each having a diameter of 15 mm, and being arranged in rows of upper elements and rows of lower elements being displaced from the latter by a distance of 2 mm. These piezoelectric elements may be operated sequentially, at any single operating frequency within a range from 800 kHz to 5 MHz, according to the voltage-time graph shown at the bottom of the figure. It has been observed that this construction of a megasonic energy delivery system provides unique acoustic pressure uniformity and minimizes interferences between groups when used in an aqueous liquid and is consequently useful for cleaning delicate parts or articles immersed in such a liquid.

EXAMPLE 3

This example is illustrated by FIG. 3 showing the spatial arrangement of a transducer comprising two or more rows of piezoelectric elements (noted as upper elements and lower elements respectively) with respect to the surface of a wafer to be cleaned. This construction shows the wafer surface at an angle of incidence of about 30° with respect to the rows of upper and lower piezoelectric elements of the transducer. This construction has been found able to minimize interactions between the piezoelectric elements when used in an aqueous liquid and is consequently useful for cleaning delicate parts or articles immersed in such a liquid.

EXAMPLE 4

This example is illustrated by FIG. 4 showing the outcome of operating the system of example 1 (one transducer). FIG. 4 shows the acoustic field distribution, after a vertical wafer scan, in the form of the maximum normalized acoustic pressure (Y axis) as a function of the horizontal distance (expressed in mm) at the surface of a wafer (X axis) during a linear vertical wafer scan.

EXAMPLE 5

This example is illustrated by FIG. 5 showing the outcome of operating two identical transducers constructed upon the system of example 1, the second transducer being shifted horizontally by 0.5 to 5 mm from the first transducer. FIG. 5 shows the acoustic field distribution, over a complete pulse period, in the form of the maximum normalized acoustic pressure (Y axis) as a function of the horizontal distance (expressed in mm) at the surface of a wafer (X axis) during a linear vertical wafer scan. By comparing this outcome to the situation of a single transducer (FIG. 4) it can be clearly seen that a further improvement in acoustic pressure uniformity is obtained.

The invention claimed is:

1. A system for delivering megasonic energy to a liquid, comprising:
one or more megasonic transducers, each transducer having a single operating frequency within an ultrasound bandwidth and comprising two or more groups of piezoelectric elements arranged in one or more rows; and
a megasonic generator means for driving the one or more megasonic transducers at frequencies within the ultrasound bandwidth, the megasonic generator means being adapted for sequentially changing the voltage applied to each of the two or more groups of piezoelectric elements so as to achieve substantially the maximum acoustic pressure for each piezoelectric element, wherein the megasonic generator means and one or more megasonic transducers is constructed and arranged so as to produce ultrasound within the liquid.

2. The system according to claim 1, wherein the megasonic generator means is adapted for driving the one or more transducers to sequentially apply acoustic field over a complete period of a pulsed control signal used for the driving of the one or more transducers.

3. The system according to claim 1, wherein the generator means is adapted so that no two adjacent piezoelectric elements in the two or more groups of piezoelectric elements are operating at the same time.

4. The system according to claim 1, wherein the one or more megasonic transducers comprise two identical megasonic transducers being displaced from each other along a first axis.

5. The system according to claim 4, wherein the displacement of the two identical megasonic transducers along the first axis is adapted to improve acoustic field uniformity with respect to a single transducer system.

6. The system according to claim 1, wherein the single operating frequency ranges from 800 kHz to 5 MHz.

7. The system according to claim 1, wherein one of the two or more groups of piezoelectric elements is circular in shape.

8. The system according to claim 1, wherein a width and a length of one of the two or more groups of piezoelectric elements are within a range from 5 to 20 mm.

9. The system according to claim 1, wherein the one or more megasonic transducers comprise at least four groups of piezoelectric elements arranged in at least two rows.

10. The system according to claim 1, wherein the system is configured for cleaning a surface of an article being immersed in a liquid.

11. An apparatus for cleaning a surface of an article, comprising:
a container for a cleaning liquid for the article;
a system configured to deliver megasonic energy to the liquid, the system comprising:
one or more megasonic transducers, each transducer having a single operating frequency within an ultrasound bandwidth and comprising two or more groups of piezoelectric elements arranged in one or more rows; and
a megasonic generator means for driving the one or more megasonic transducers at frequencies within the ultrasound bandwidth, the megasonic generator means being adapted for changing the voltage applied to each of the two or more groups of piezoelectric elements so as to achieve substantially the same maximum acoustic pressure for each piezoelectric element, wherein the megasonic generator means and one or more megasonic transducers is constructed and arranged so as to produce ultrasound within the liquid; and
means within the container for disposing the article with the surface at an angle of incidence from 15° to 45° with respect to the two or more rows of piezoelectric elements of the energy delivering system.

12. A system for delivering megasonic energy to a liquid, comprising:
one or more megasonic transducers, each transducer having a single operating frequency within an ultrasound bandwidth and comprising four groups of individual piezoelectric elements arranged in four rows of alternating individual piezoelectric elements; and
a megasonic generator means for driving the one or more megasonic transducers at frequencies within the ultrasound bandwidth, the megasonic generator means being adapted for sequentially changing the voltage applied to:
a first group of individual piezoelectric elements during a first time period;
a second group of individual piezoelectric elements during a second time period;
a third group of individual piezoelectric elements during a third time period; and
a fourth group of individual piezoelectric elements during a fourth time period,
so as to achieve substantially the maximum acoustic pressure for each individual piezoelectric element, and wherein the megasonic generator means and one or more megasonic transducers is constructed and arranged so as to produce ultrasound within the liquid.

13. The system according to claim 12, wherein the generator means is adapted so that no two adjacent piezoelectric elements in the four groups of individual piezoelectric elements are operating at the same time.

14. The system according to claim 12, wherein at least one of the four groups of piezoelectric elements is circular in shape.

15. The system according to claim 12, wherein a width and a length of at least one of the four groups of piezoelectric elements differs from at least one of other groups of the four groups of piezoelectric elements.

16. The system according to claim 12, further comprising each piezoelectric element being circular in shape, having a diameter of 15 mm, and being arranged in rows of upper elements and rows of lower elements being displaced from the latter by a distance of 2 mm.

\* \* \* \* \*